United States Patent
Periasamy et al.

(10) Patent No.: US 7,141,487 B2
(45) Date of Patent: Nov. 28, 2006

(54) METHOD FOR ULTRA THINNING BUMPED WAFERS FOR FLIP CHIP

(75) Inventors: Ganesh Vetrivel Periasamy, Singapore (SG); Vaidyanathan Kripesh, Singapore (SG)

(73) Assignee: Agency for Science Technology and Research, Singapore (SG)

( * ) Notice: Subject to any disclaimer, the term of this patent is extended or adjusted under 35 U.S.C. 154(b) by 60 days.

(21) Appl. No.: 10/883,914

(22) Filed: Jul. 1, 2004

(65) Prior Publication Data

US 2006/0003550 A1    Jan. 5, 2006

(51) Int. Cl.
 *H01L 21/50*  (2006.01)
(52) U.S. Cl. ............... 438/459; 257/E21.001
(58) Field of Classification Search .......... 438/113, 438/459, 460, 690
See application file for complete search history.

(56) References Cited

U.S. PATENT DOCUMENTS

| | | | | |
|---|---|---|---|---|
| 6,107,164 A * | 8/2000 | Ohuchi | ............... | 438/465 |
| 6,338,980 B1 | 1/2002 | Satoh | ............... | 438/106 |
| 6,350,664 B1 * | 2/2002 | Haji et al. | ............... | 438/459 |
| 6,476,501 B1 * | 11/2002 | Ohuchi et al. | ............... | 257/778 |
| 6,500,764 B1 | 12/2002 | Pritchett | ............... | 438/690 |
| 6,579,748 B1 * | 6/2003 | Okuno et al. | ............... | 438/124 |
| 6,638,837 B1 | 10/2003 | Tsao et al. | ............... | 438/459 |
| 6,949,158 B1 * | 9/2005 | Ball et al. | ............... | 156/154 |

OTHER PUBLICATIONS

"Key Challenges in Fine Pitch Bumped Wafer Mechanical Back Grinding and Polishing", by Ganesh VP, et al., *2003 Int'l Conf. on Elec. Packaging*, pp. 260-265, Tokyo, Japan.
The International Technology Roadmap for Semiconductors; 2002 Update, 2002 Update Tables, pp. 100-111.
"Stress and Reliability Analysis of Electronic Packages with Ultra-thin Chip", by Shkaragev, et al., *Transactions of the ASME*, vol. 125, Mar. 2003, pp. 98-103.
"Thinning Wafers for Flip Chip Applications, High Density Interconnect," by David Francis, Tru-Si Technologies, Sunnyvale, CA.

* cited by examiner

*Primary Examiner*—Scott B. Geyer
(74) *Attorney, Agent, or Firm*—Saile Ackerman LLC; Stephen B. Ackerman; Rosemary L. S. Pike

(57) ABSTRACT

In an improved method for bumped wafer thinning, a wafer is provided having a front side and a back side wherein contact pads are formed on the top surface. A dry film is formed on the front side of the wafer and openings are provided in the dry film to the contact pads. Interconnections, such as solder bumps, are formed within the openings on the contact pads. A back grind tape or carrier is attached to the dry film and overlying the interconnections. Thereafter, the wafer is thinned from the back side of the wafer.

55 Claims, 5 Drawing Sheets

US 7,141,487 B2

METHOD FOR ULTRA THINNING BUMPED WAFERS FOR FLIP CHIP

BACKGROUND OF THE INVENTION

1) Field of the Invention

The invention relates to a method of bumped wafer thinning, and more particularly, to a method of wafer thinning by a mechanical back grinding method.

2) Description of the Prior Art

Conventional bumped wafer thinning starts with a bumped wafer that is laminated to a back grind (BG) tape to the front side of the wafer followed by backside wafer thinning. FIG. 1 illustrates the bumped wafer thinning process. The silicon wafer 100 has solder bumps 150 formed on a top side of the wafer and laminated to BG tape 120. The top of the wafer 100 is held to a vacuum chuck 130. Grinding wheel 140 is shown. The grinding wheel will thin the wafer from the backside. Challenges in conventional bumped wafer thinning include the following. 1.) Successful ultra thinning of a bumped wafer largely depends on the availability of back grind (BG) tape respective to the bump geometry. BG tapes are available in the market for bump heights in the range of 100–200 μm. For bump heights greater than 200 μm it is difficult to manufacture BG tapes with thicker cushioning layer thickness and hence thinning becomes very difficult. 2.) Total Thickness Variation (TTV) control largely depends on the tape selection, tape lamination process without any air traps, and optimized BG and polishing processes. 3.) FIG. 2 summarizes the issues with conventional bumped wafer thinning.

1) Stressed solder balls 210 and UBM 212. During the mechanical back grinding process the solder balls and UBM are stressed if proper tape selection is not done.

2) Mechanical Force difference. The mechanical grinding process exerts a certain amount of force onto the silicon wafer in order to physically machine the silicon surface. With the bumped wafers, there is always a difference in force exerted above the bump area 214 and the region without bumps 216.

4) Surface Irregularities 218. The difference in the force exerted on the region with and without bumps leads to formation of dimples (surface irregularities) on the back side of the wafer. With ultra thinning of bumped wafers the surface irregularities become the potential area of failures.

5) Contamination due to adhesives 220. In the BG tape lamination process, the tape adhesive with cushioning layers are squeezed between the bumps. During de-taping, remains of adhesives may be left on the bump surface. These tape contaminants adversely affect the Flip Chip interconnection process.

The paper "Key Challenges in Fine Pitch Bumped Wafer Mechanical Back Grinding and Polishing", by Ganesh V P, V Kripesh, Kumaran Pakiri, and George Itoh, 2003 *International Conference on Electronics Packaging*, pp 260–265, Tokyo, Japan, discusses these issues.

A number of patents address thinning bumped wafers. Most of the reported methods use resin/wax coated to the active side of the wafer with the bumps and taped before thinning the wafer. U.S. Pat. No. 6,338,980 to Satoh describes a method of thinning bumped wafers for WLP and chip scale package (CSP) applications. The advantages of this method include thinning without edge damage and normal handling. However, there are too many process steps, including ashing and resin curing, which require process optimization for different bump heights. The dicing operation must be performed twice. Furthermore, proprietary resins are used. U.S. Pat. No. 6,500,764 to Pritchett shows a method for thinning bumped wafers. This process results in good TTV control, but requires additional process steps for forming dummy bumps. Since the wafer has dummy bumps, tape lamination cannot seal the edges resulting in grinded silicon particle and slurry contamination issues. U.S. Pat. No. 6,638,837 to Tsao et al discloses a method for applying an organic passivation layer or an aqueous material for protection of the active surface, front side, of semiconductor wafers during the operations of backside grinding, transporting, and packaging. Disadvantages of this process include additional process steps and higher materials cost. The process method for depositing the liquid material will have a lot of waste which will have impact on the cost.

SUMMARY OF THE INVENTION

A principal object of the present invention is to provide an effective and very manufacturable method for fabricating an ultra thin bumped wafer for flip chip application.

Another object of the invention is to provide a method for bumped wafer thinning to 100 μm and below.

A further object of the invention is to provide a method for bumped wafer thinning that can handle a wide range of bump heights.

Yet another object is to provide a method for bumped wafer thinning without using special BG tapes.

A still further object is to provide a method for bumped wafer thinning that uses a standard silicon wafer thinning recipe and conventional IC assembly equipment.

Yet another object is to provide a method for bumped wafer thinning that can achieve good TTV control and high yield.

In accordance with the objects of this invention an improved method for bumped wafer thinning is achieved. A wafer is provided having a front side and a back side wherein contact pads are formed on the front side. A dry film is formed on the front side of the wafer and openings are provided in the dry film to the contact pads. Interconnections, such as solder bumps, are formed within the openings on the contact pads. A back grind tape or carrier is attached to the dry film and overlying the interconnections. Thereafter, the wafer is thinned from the back side of the wafer.

BRIEF DESCRIPTION OF THE DRAWINGS

In the accompanying drawings forming a material part of this description, there is shown.

DESCRIPTION OF THE PREFERRED EMBODIMENTS

The present invention discloses a method for fabricating ultra thin bumped wafers for flip chip application. By this process, the number of steps for ultra thinning bumped wafers are reduced and ultra thinning is possible with high yield, excellent TTV control, and a wide range of bump heights The process does not require special BG tapes or special process parameter optimization and uses existing bumping and thinning equipment available in electronic packaging manufacturing facilities.

In the process of the present invention, a dry film laminated wafer is aligned to a bumping mask, exposed and developed. After developing, the solder paste is printed followed by reflow. BG tape is laminated on top of the dry film and the bumped wafer is thinned. After thinning, the wafer is attached to a carrier and then the BG tape is removed followed by dry film stripping. The thin bumped wafer is reflowed again for self-aligning of the solder balls to the UBM pads.

Figure 1:
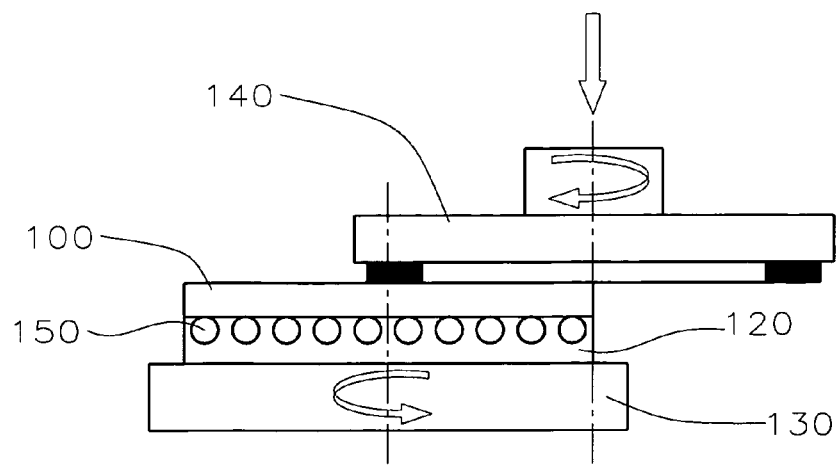
FIG. 1 illustrates in cross-sectional representation a conventional bumped wafer thinning process.
Figure 2:
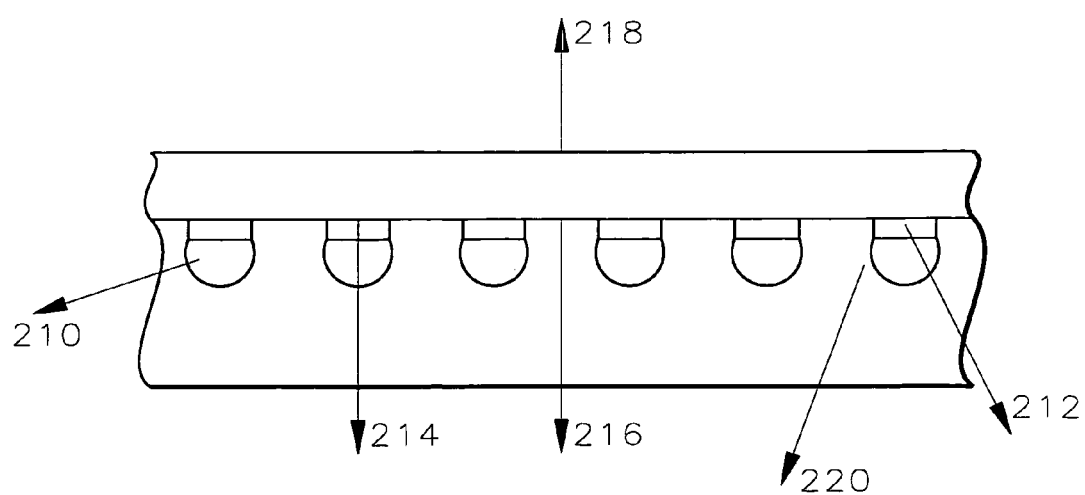
FIG. 2 schematically illustrates in cross-sectional representation some of the problems associated with a conventional bumped wafer thinning process.
Figure 3:
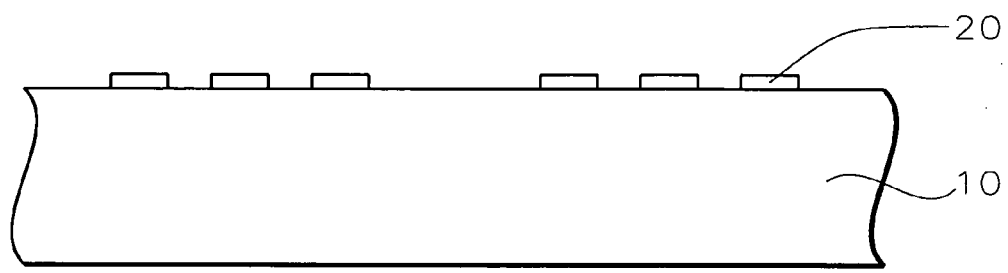
FIGS. 3 through 14 illustrate in cross-sectional representation a preferred embodiment of the present invention.
Figure 4:
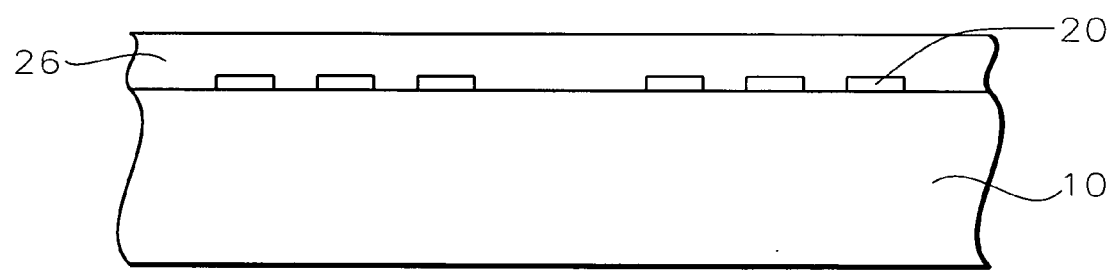

The process will now be described in further detail with reference to FIGS. 3–14. Referring now more particularly to FIG. 3, there is shown a semiconductor substrate 10, preferably composed of monocrystalline silicon. Alternatively, the wafer can be any III–V compound wafer, silicon germanium (SiGe), or any other wafer that is used for semiconductor device fabrication. Semiconductor device structures, not shown, are formed on the wafer. For example, these may include gate electrodes and associated source and drain regions, and multiple layers of interconnecting lines. These structures are topped with a passivation layer. Under bump metallization (UBM) pads 20 have been formed on the passivation layer of wafer 10 as is conventional in the art. For example, UBM pads may comprise Ti/Ni(V)/Au, Electroless Nickel Immersion Gold (ENIG), Cu/Ta/Cu, or Ti/Ni(V)/Cu/Au. Referring now to FIG. 4, a dry film 26 is laminated onto the silicon wafer 10. The dry film can also be any spin coated photo resist or any polymer material.

Figure 5:
Figure 5:
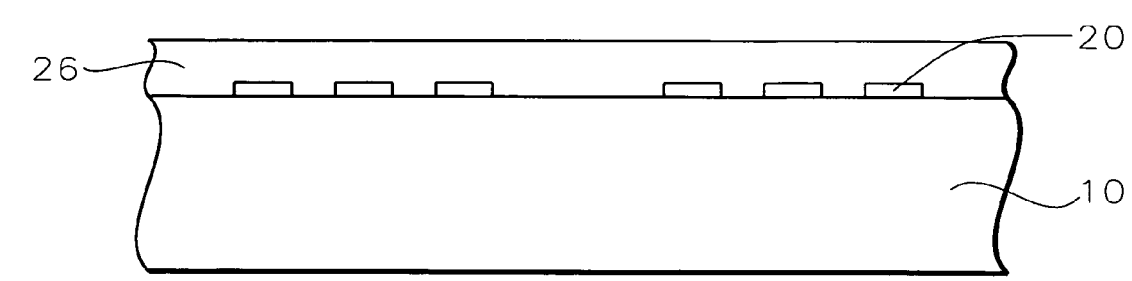
Figure 6:
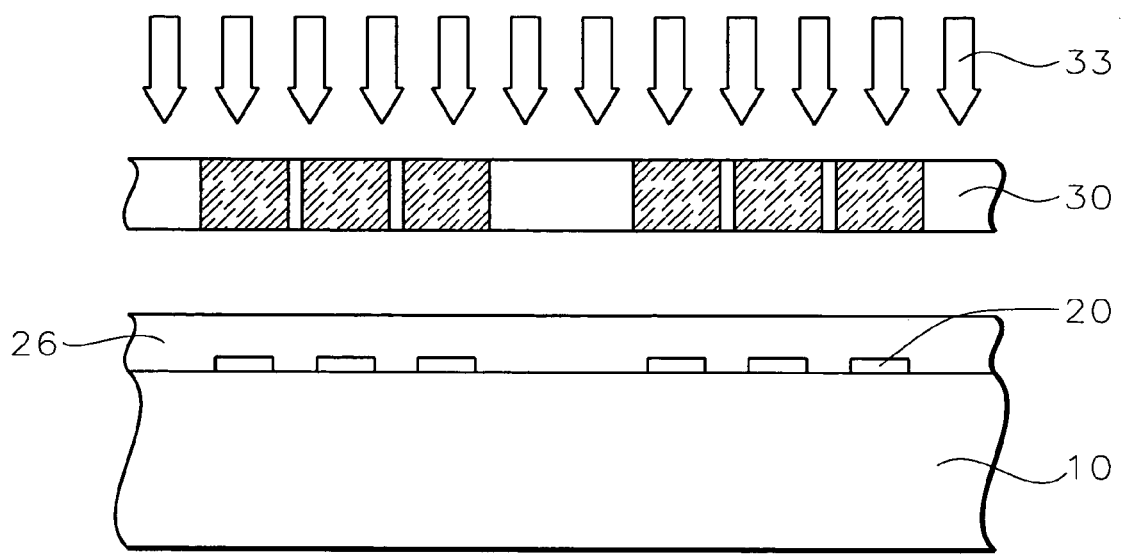
Figure 7:
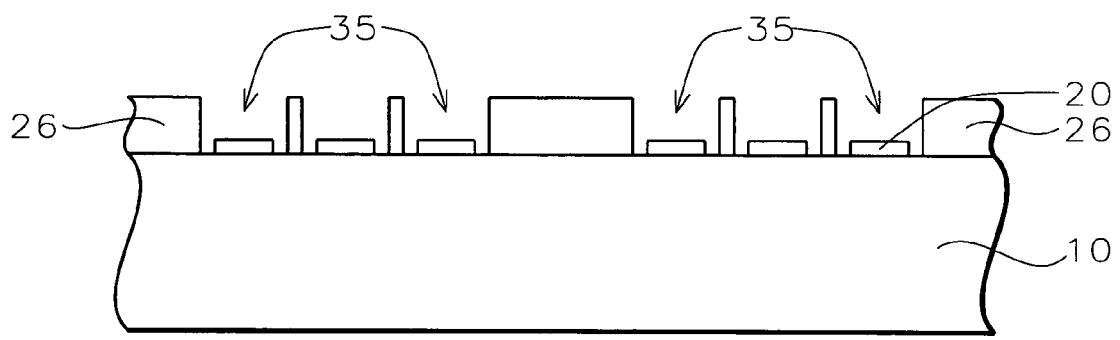

The wafer 10 is aligned with a bumping mask 30, as shown in FIG. 5. Now, the dry film is exposed through the mask 30 as shown in FIG. 6. For example, depending on the type of dry film 26, the film may be exposed to UV light, actinic light, or electron beams, 33, for example. The dry film is developed to leave openings 35 to the UBM pads as shown in FIG. 7.

Figure 8:
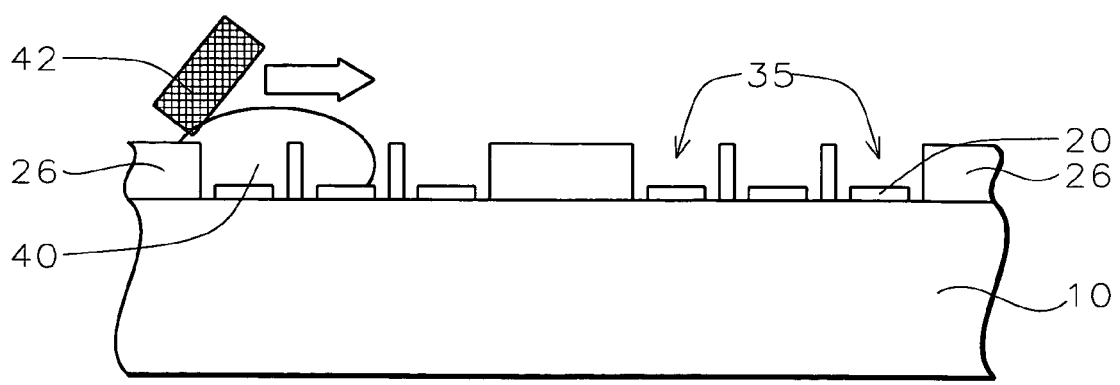
Figure 9:
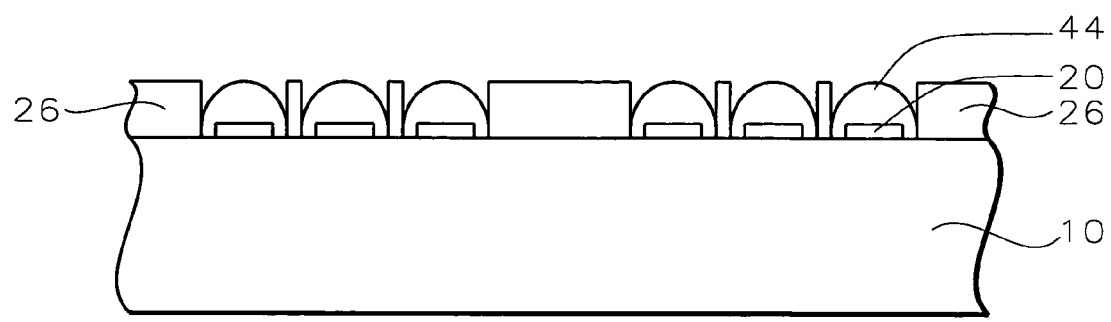

Now, solder bumps are formed on the UBM pads. For example, as shown in FIG. 8 in a solder paste printing method, a solder paste 40 is applied to the wafer and squeezed into the openings 35 as shown by 42. The solder is reflowed to form solder bumps 44, as shown in FIG. 9. Alternatively, the dry film could be a photoresist layer that is patterned to form openings 35. Solder bumps 44 can be plated into the openings using an electroplating process. The pattern of openings in the dry film can be defined by other methods such as laser drilling or a DRIE process and then the solder bumps can be formed by solder paste printing or plating. Bumps 44 can be solder bumps, Electroless Nickel Immersion Gold bumps, or Gold bumps (plated or stud bumps), and so on.

Figure 10:
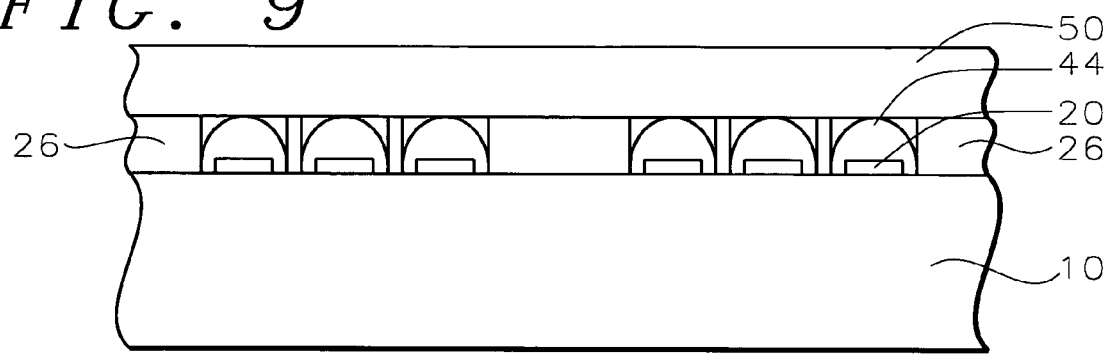

It is a key feature of the present invention that the dry film 26 remains on the wafer surface after the solder bumps are formed. Then, as shown in FIG. 10, BG tape 50 is laminated over the dry film 26. A standard BG tape can be used in the process of the invention regardless of the bump height. This is because the dry film compensates for the bump height.

Figure 11:
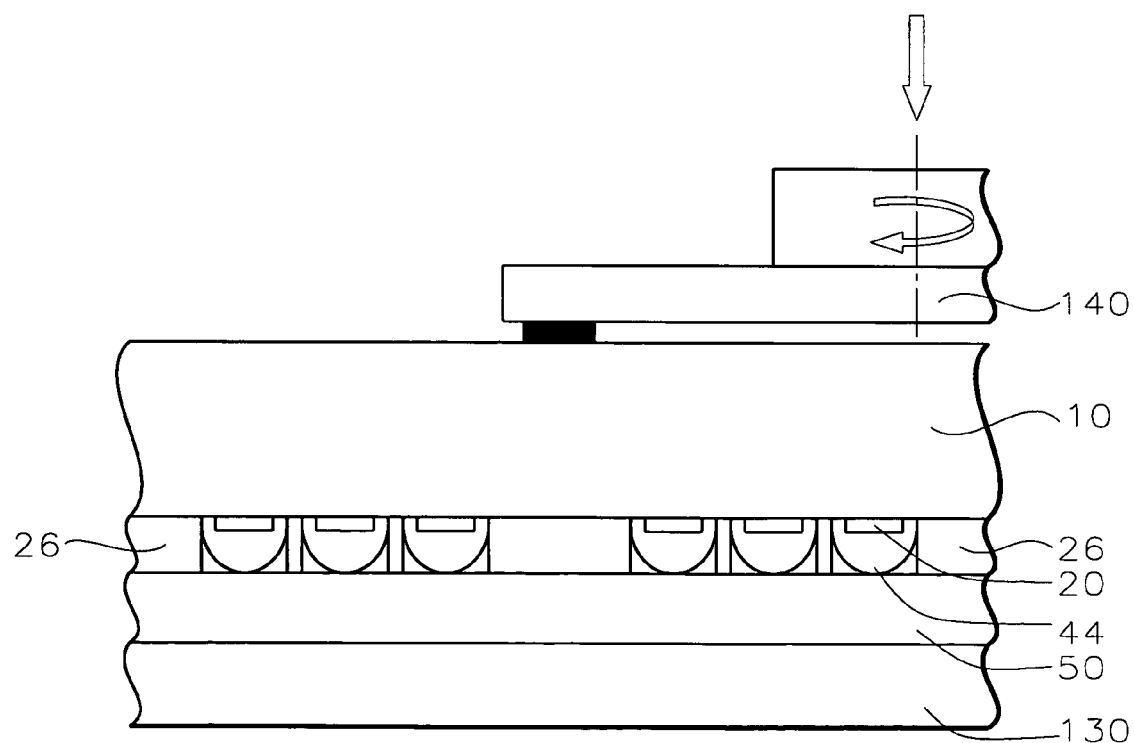

Referring now to FIG. 11, the wafer is held by a vacuum chuck 130 to a grinding wheel 140. The wafer 10 is ground by mechanical back grinding. Standard wafer thinning parameters are used in coarse grind, fine grind, and polishing processes to thin to wafer to, for example, 100 μm. Alternatively, the wafer can be thinned by a wet chemical etch or a plasma etch or by a combination of mechanical grinding and wet/dry etching methods.

Figure 12:
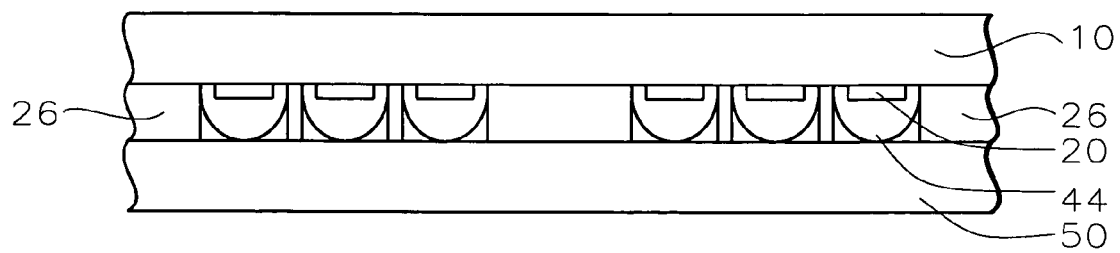
Figure 13:
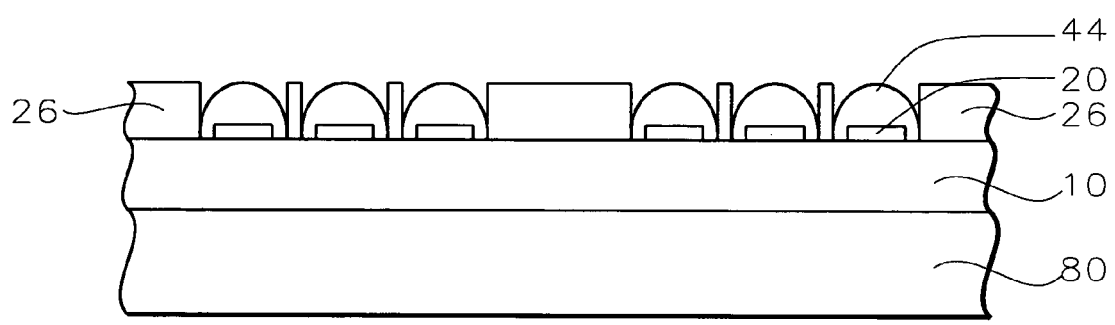
Figure 14:
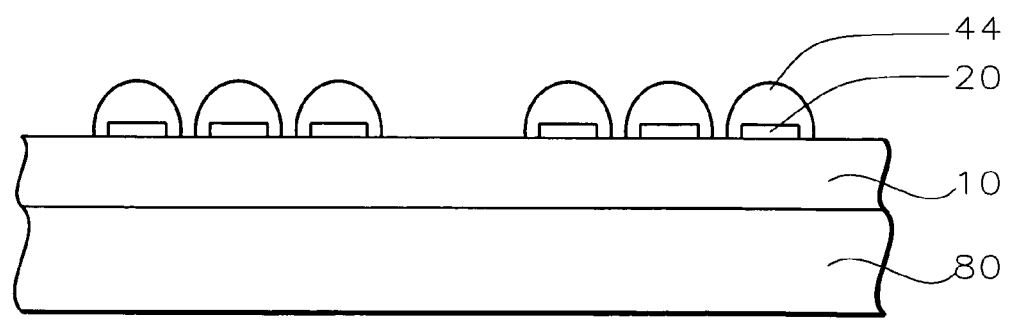

The wafer is shown after thinning in FIG. 12. Now the BG tape 50 is removed by conventional methods as shown in FIG. 13. The wafer is attached to a carrier 80. Then, the dry film 26 is stripped as shown in FIG. 14.

Instead of solder bumps 44, any other interconnecting method between the wafer and the substrate 10 can be used. Instead of the BG tape, any support carrier made of metal or another wafer can be used in the process of the invention.

The wafer can be diced either before or after thinning. The wafer can be pre-diced prior to thinning. After the openings 35 are formed, the tape can be attached and the wafer thinned. Then, the solder bumps or other interconnecting method can be formed after thinning.

The process of the present invention provides a novel low cost method for fabricating thin bumped wafers with a wide range of bump heights. The invention entails a simple process flow using existing assembly and packaging equipment. Ultra thin bumped wafers can be fabricated with high yield. The final silicon thickness can be as thin as 50 μm. Reduced surface irregularities and residual stress on the thinned bumped wafer and excellent TTV control are advantages of the present invention. Ultra thin wafers manufactured by the process of the present invention can be used in making flip chip assemblies like Direct Chip Attach (Wafer Level Packages) or other ultra thin electronic package modules such as stacked chip scale packages (CSP), system in package (SiP), silicon stacked module, and other emerging ultra thin electronic packages.

While the invention has been particularly shown and described with reference to the preferred embodiments thereof, it will be understood by those skilled in the art that various changes in form and details may be made without departing from the spirit and scope of the invention.

What is claimed is:

1. A method of thinning a wafer comprising:
   providing a wafer having a front side and a back side wherein contact pads are formed on said front side;
   forming a dry film on said front side of said wafer and providing openings in said dry film to said contact pads;
   forming interconnections within said openings on said contact pads; and
   after said providing said openings in said dry film, thinning said wafer from said back side.

2. The method according to claim 1 wherein said forming said interconnections comprises:
   applying solder paste to said top surface of said wafer;
   printing said solder paste into said openings; and
   relflowing said solder paste to form solder bumps within said openings.

3. The method according to claim 1 wherein said forming said interconnections comprises:
   plating solder bumps into said openings.

4. The method according to claim 1 wherein said interconnections comprise solder bumps, Electroless Nickel Immersion Gold bumps, or Gold bumps (plated or stud bumps).

5. The method according to claim 1 wherein said forming said interconnections is before or after said thinning.

6. The method according to claim 1 wherein said thinning of said wafer is by a mechanical back grinding process, a wet etch process, a plasma etch process, or a combination of these processes.

7. The method according to claim 1 after said thinning of said wafer, further comprising:
   removing said carrier and said dry film; and
   attaching said wafer to an electronic package module.

8. The method according to claim 7 wherein said electronic package module is a flip chip assembly comprising Direct Chip Attach (WLP), stacked chip scale packages (CSP), system in package (SiP), or Silicon stacked module.

9. The method according to claim 1 further comprising dicing said wafer wherein said dicing can be performed after said thinning of said wafer or prior to said thinning of said wafer.

10. The method according to claim 1 wherein said wafer comprises silicon, silicon germanium, any III–V compound wafer, or any wafer used in semiconductor device fabrication.

11. The method according to claim 1 wherein said contact pads comprise under bump metallization (UBM).

12. The method according to claim 1 wherein said UBM comprises Ti/Ni(V)/Au, Electroless Nickel Immersion Gold (EMG), Cu/Ta/Cu, or Ti/Ni(V)/Cu/Au.

13. The method according to claim 1 wherein said forming said dry film comprises laminating a photoresist or polymer material on said wafer.

14. The method according to claim 1 wherein said providing said openings comprises:
exposing said dry film through a mask; and
developing said exposed dry film to form openings.

15. The method according to claim 1 wherein said providing said openings comprises:
etching said openings into said dry film.

16. The method according to claim 1 wherein said providing said openings is performed by laser drilling, DRIE, or exposure and developing.

17. The method according to claim 1 further comprising:
attaching a carrier to said dry film and overlying said openings.

18. The method according to claim 17 wherein said carrier is a BG tape.

19. The method according to claim 17 wherein said carrier is a metal support carrier.

20. The method according to claim 17 wherein said carrier is a support wafer.

21. A method of thinning a wafer comprising:
providing a wafer having a front side and a back side wherein contact pads are formed on said front side;
forming a dry film on said front side of said wafer and providing openings in said dry film to said contact pads;
forming interconnections within said openings on said contact pads;
attaching a carrier to said dry film and overlying said openings; and
after said providing said openings in said dry film, thinning said wafer from said back side of said wafer.

22. The method according to claim 21 wherein said wafer comprises silicon, silicon germanium, any III–V compound wafer, or any other wafer used in semiconductor device fabrication.

23. The method according to claim 21 wherein said contact pads comprise under bump metallization (UBM).

24. The method according to claim 23 wherein said UBM comprises Ti/Ni(V)/Au, Electroless Nickel Immersion Gold (ENIG), Cu/Ta/Cu, Ti/Ni(V)/Cu/Au.

25. The method according to claim 21 wherein said forming said dry film comprises laminating a photoresist or polymer material on said wafer.

26. The method according to claim 21 wherein said providing said openings comprises:
exposing said dry film through a mask; and
developing said exposed dry film to form openings.

27. The method according to claim 21 wherein said providing said openings comprises:
etching said openings into said dry film.

28. The method according to claim 21 wherein said providing said openings is performed by laser drilling, DRIE, or exposure and developing.

29. The method according to claim 21 wherein said forming said interconnections comprises:
applying solder paste to said top surface of said wafer;
printing said solder paste into said openings; and
relflowing said solder paste to form solder bumps within said openings.

30. The method according to claim 21 wherein said forming said interconnections comprises:
plating solder bumps into said openings.

31. The method according to claim 21 wherein said interconnections comprise solder bumps, Electroless Nickel Immersion Gold bumps, or Gold bumps (plated or stud bumps).

32. The method according to claim 21 wherein said forming said interconnections is performed prior to said thinning of said wafer or after said thinning of said wafer.

33. The method according to claim 21 wherein said carrier is a BG tape.

34. The method according to claim 21 wherein said carrier is a metal support carrier.

35. The method according to claim 21 wherein said carrier is a support wafer.

36. The method according to claim 21 wherein said thinning of said wafer is by a mechanical back grinding process, a wet etch process, a plasma etch process, or a combination of these processes.

37. The method according to claim 21 after said thinning of said wafer, further comprising:
removing said carrier and said dry film; and
attaching said wafer by said interconnections to an electronic package module.

38. The method according to claim 37 wherein said electronic package module is a flip chip assembly comprising Direct Chip Attach (WLP), stacked chip scale packages (CSP), system in package (SiP), or Silicon stacked module.

39. The method according to claim 21 further comprising dicing said wafer wherein said dicing can be performed after said thinning of said wafer or prior to said thinning of said wafer.

40. A method of forming an ultra thin electronic package comprising:
providing a wafer having a front side and a back side wherein contact pads are formed on said front side;
forming a dry film on said front side of said wafer and providing openings in said dry film to said contact pads;
forming interconnections within said openings on said contact pads;
attaching a carrier to said dry film and overlying said interconnections;
thereafter thinning said wafer from said back side;
thereafter removing said carrier and said dry film; and
thereafter attaching said wafer by said interconnections to an electronic package module.

41. The method according to claim 40 wherein said wafer comprises silicon, silicon germanium, any III–V compound wafer, or any other wafer used in semiconductor device fabrication.

42. The method according to claim 40 wherein said contact pads comprise under bump metallization (UBM).

43. The method according to claim 40 wherein said UBM comprises Ti/Ni(V)/Au, Electroless Nickel Immersion Gold (ENIG), Cu/Ta/Cu, or Ti/Ni(V)/Cu/Au.

44. The method according to claim 40 wherein said forming said dry film comprises laminating a photoresist or polymer material on said wafer.

45. The method according to claim 40 wherein said providing said openings comprises:
 exposing said dry film through a mask; and
 developing said exposed dry film to form openings.

46. The method according to claim 40 wherein said providing said openings comprises:
 etching said openings into said dry film.

47. The method according to claim 40 wherein said providing said openings is performed by laser drilling, DRIE, or exposure and developing.

48. The method according to claim 40 wherein said forming said interconnections comprises:
 applying solder paste to said top surface of said wafer;
 printing said solder paste into said openings; and
 relflowing said solder paste to form solder bumps within said openings.

49. The method according to claim 40 wherein said forming said interconnections comprises:
 plating solder bumps into said openings.

50. The method according to claim 40 wherein said interconnections comprise solder bumps, Electroless Nickel Immersion Gold bumps, or Gold bumps (plated or stud bumps).

51. The method according to claim 40 wherein said carrier is a BG tape.

52. The method according to claim 40 wherein said carrier is a metal support carrier.

53. The method according to claim 40 wherein said carrier is a support wafer.

54. The method according to claim 40 wherein said thinning of said wafer is by a mechanical back grinding process, a wet etch process, a plasma etch process, or a combination of these processes.

55. The method according to claim 40 wherein said electronic package module is a flip chip assembly comprising Direct Chip Attach (WLP), stacked chip scale packages (CSP), system in package (SiP), or Silicon stacked module.

\* \* \* \* \*